United States Patent
Roither et al.

[19]

[11] Patent Number: 6,028,469
[45] Date of Patent: Feb. 22, 2000

[54] ELECTRIC CIRCUIT ARRANGEMENT COMPRISING A SWITCHABLE FEEDBACK BRANCH

[75] Inventors: Gerhard Roither, München; Günther Hackl, Altötting; Üwe Fischer, Unterhaching, all of Germany

[73] Assignee: STMicroelectronics GmbH, Grasbrunn, Germany

[21] Appl. No.: 08/994,791

[22] Filed: Dec. 19, 1997

[30] Foreign Application Priority Data

Dec. 19, 1996 [DE] Germany .................. 196 53 191

[51] Int. Cl.$^7$ ...................................... G06G 7/12
[52] U.S. Cl. ........................ 327/362; 327/95; 327/307; 327/363; 330/9; 330/278; 330/281; 330/294
[58] Field of Search ............... 327/94–96, 337, 327/345, 362, 363, 307; 330/9, 260, 278, 281, 293, 294

[56] References Cited

U.S. PATENT DOCUMENTS

| Re. 28,579 | 10/1975 | Uchida | 327/345 |
|---|---|---|---|
| 4,320,347 | 3/1982 | Haque | 330/9 |
| 4,393,351 | 7/1983 | Gregorian et al. | 327/362 |
| 4,578,646 | 3/1986 | Maio et al. | 327/307 |
| 4,806,874 | 2/1989 | Michel | 330/9 |
| 5,585,756 | 12/1996 | Wang | 327/337 |

FOREIGN PATENT DOCUMENTS

| 0150606A1 | 8/1985 | European Pat. Off. . |
|---|---|---|
| 63-204911 | 8/1988 | Japan . |

OTHER PUBLICATIONS

Ming Zhang et al., "A Parallel Trimming Method of Offset Reduction for Comparators and Amplifiers." May 30, 1994, pp. 715–718.

*Primary Examiner*—Kenneth B. Wells
*Attorney, Agent, or Firm*—Theodore E. Galanthay; E. Russell Tarleton; Seed and Berry LLP

[57] ABSTRACT

An electric circuit having a switchable feedback branch switchable between a first feedback state, in which the circuit arrangement has a frequency response that is stable with respect to an oscillation tendency, and a second feedback state, in which the circuit arrangement has a frequency response that is unstable with respect to an oscillation tendency. The circuit includes a switchable frequency response compensation circuit which during the first feedback state of the feedback branch can be controlled to an ineffective state and during the second feedback state of the feedback branch can be controlled to an effective state, and in the effective state causes such compensation of the frequency response of the circuit arrangement in the second feedback state that the circuit arrangement in the second feedback state remains stable with respect to an oscillation tendency.

16 Claims, 1 Drawing Sheet

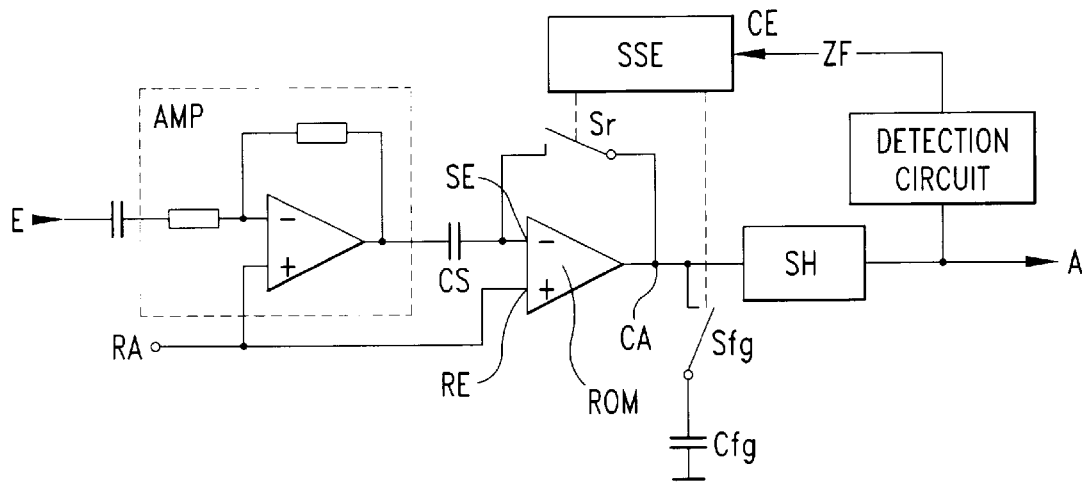
*Fig. 1*
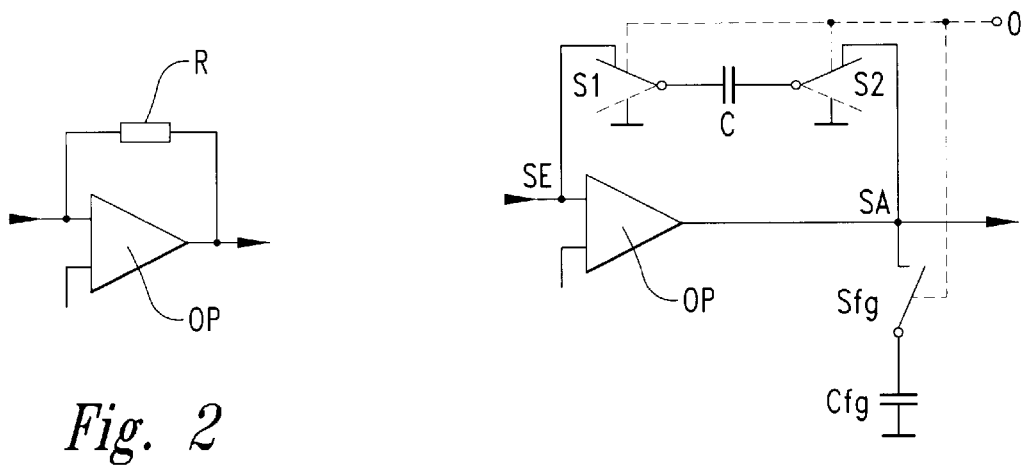
*Fig. 2*
*Fig. 3*

ELECTRIC CIRCUIT ARRANGEMENT COMPRISING A SWITCHABLE FEEDBACK BRANCH

TECHNICAL FIELD

The invention relates to an electric circuit arrangement comprising a switchable feedback loop which is switchable between a first feedback state, in which the circuit arrangement has a frequency response that is stable with respect to an oscillation tendency, and a second feedback state, in which the circuit arrangement has a frequency response that is unstable with respect to an oscillation tendency.

BACKGROUND OF THE INVENTION

There are many electric feedback circuits having a feedback branch between a signal output and a signal input of a signal processing circuit. When the signal processing circuit acts as an amplifier, undesirable oscillations of the feedback circuit may occur due to the feedback. Such oscillations can appear when the overall amplification of the feedback circuit is larger than 1 and when the signal portion fed back from the signal output of the signal processing circuit via the feedback branch to its signal input, has approximately the same phase as the input signal fed from a signal source to the signal input of the signal processing circuit (regenerative feedback). For avoiding undesirable oscillation of the feedback circuit, the overall amplification or gain of the feedback circuit must be kept lower than 1 and/or the phase position of the output signal, which is fed back via the feedback branch to the signal input of the signal processing circuit, must be kept in a sufficient phase distance from the case of phase-identical regenerative feedback.

For realizing the second-mentioned measure it is possible to use in conventional manner a frequency response compensation circuit by means of which the frequency response of the feedback circuit is changed in the frequency range in which an oscillation tendency exists, in such a manner that said oscillation tendency is eliminated. To this end, one can use conventionally a frequency response compensation capacitor connected between the signal output of the feedback circuit and a ground terminal. This frequency response compensation capacitor has the effect that the frequency response of the feedback circuit is lowered in the upper frequency range. This means that the frequency spectrum of the signal processed with the feedback circuit is curtailed in the upper frequency range.

Such a frequency response decrease results in a reduction of the gain-bandwidth product of the frequency response compensated circuit. When the feedback circuit serves for processing or producing square wave pulses, the frequency response compensation effective in the upper frequency range results in a steepness reduction of the pulse edges of such a square wave signal. Both is undesirable, the latter in particular for fast digital circuits.

Examples for electric feedback circuit arrangements comprising a feedback branch which is switchable between two different feedback states in the manner indicated at the outset, are on the one hand an amplifier that is fed back in SC technology (switched capacitor technology), or a comparator which, via a switch connected between the comparator input and the comparator output, is switchable between a feedback-free state and a state with high feedback.

SC technology is used in the field of monolithically integrated circuits. In this respect, ohmic resistors, for example in the feedback branch connected to an amplifier, are not formed as genuine resistors in the integrated circuit since these require, on the one hand, much chip area of the integrated circuit and, on the other hand, are difficult to produce with close tolerances of their resistance value, but they are simulated by switched capacitors which need less chip area and can be produced with closer tolerances. In case of the already known SC technology, a capacitor replacing the ohmic resistor is periodically reversed in terms of charge by means of two switches disposed on both sides of the capacitor. In case of an amplifier with an SC feedback, a first SC switch is provided between an SC capacitor and the amplifier input and a second SC switch is provided between the SC capacitor and the amplifier output. In a second switching state of the two SC switches, the amplifier output is fed back via the SC capacitor to the amplifier input. In a first switching state of the two SC switches, the two sides of the SC capacitor are each connected to a ground terminal. With this amplifier circuit the two SC switches thus cause switching over of the feedback branch such that in the second switching state a feedback exists via the SC capacitor, whereas in the first switching state the feedback branch is open and thus no feedback occurs.

The already mentioned comparator having a switch in the feedback branch is utilized for an analog-signal to square-wave-signal reshaping circuit with offset compensation as it is described in more detail in the same applicant's patent application submitted simultaneously with the present application and entitled "Analog-signal to square-wave-signal reshaping device with offset compensation" (U.S. patent application Ser. No. 08/944,073, filed Dec. 19, 1997). With this reshaping circuit, a controllable switch is connected between the comparator output and the comparator input of an offset-inflicted comparator, with said switch being open during normal comparator operation, so that no feedback takes place between comparator output and comparator input, and said switch, for the purpose of offset measurement and offset storage in an offset storage capacitor, being temporarily closed and then effecting a strong feedback between comparator output and comparator input. While in case of the amplifier with the SC feedback, feedback exists via the SC capacitor and in case of the comparator with offset compensation, feedback exists via the feedback switch controlled to the conducting state, there may be instability with respect to an oscillation tendency. This can be eliminated in the manner mentioned hereinbefore by means of the frequency response compensation circuit, in particular in the form of the already mentioned frequency response compensation capacitor, however with the also already mentioned loss in gain-bandwidth product and pulse edge steepness, respectively.

SUMMARY OF THE INVENTION

It is an object of the invention to take measures in circuit arrangements with switchable feedback and oscillation tendency, through which the oscillation tendency is eliminated without an undesirable or impairing reduction in the gain-bandwidth product or a reduction in edge steepness being caused.

This object is met with a circuit arrangement according to the invention, as indicated in the claims appended hereto.

Accordingly, the present invention provides an electric feedback circuit comprising a switchable feedback branch which is switchable between a first feedback state, in which the feedback circuit has a frequency response that is stable with respect to an oscillation tendency, and a second feedback state, in which the feedback circuit has a frequency response that is unstable with respect to an oscillation tendency, and comprising a switchable frequency response compensation circuit which during the first feedback state of the feedback branch can be controlled to an ineffective state and during the second feedback state of the feedback branch can be controlled to an effective state, and in the effective state causes such compensation of the frequency response of the feedback circuit in the second feedback state that the feedback circuit in the second feedback state remains stable with respect to an oscillation tendency.

The two different feedback states can be conditions with differently strong feedback or a condition with feedback and a condition with open feedback branch, i.e., without feedback.

In the cases with switchable feedback, for example in the two already mentioned examples of an amplifier with an SC feedback and a comparator circuit for analog-signal to square-wave-signal reshaping with offset compensation, the frequency response of the feedback circuit in general is important only during the feedback-free state. When looking for example at the comparator circuit for analog-signal to square-wave-signal reshaping, the ability to produce steep pulse edges is of interest only during those periods of time which pulse edges actually occur, but not therebetween. In case of the solution according to the invention, in which the frequency response compensation is performed only during the switching state with feedback, the pulse edges of the square wave signal thus are impaired in no way by the frequency response compensation circuit since the frequency response compensation circuit is switched to the ineffective condition during the periods of occurrence of pulse edges.

In a preferred embodiment of the invention, the frequency response compensation circuit comprises a series connection including a controllable frequency response compensation switch and a frequency response compensation capacitor and connected between an output of the feedback circuit and a ground terminal. During that feedback state during which an oscillation tendency is present, the frequency response compensation switch is controlled to the conducting state, so that lowering of the frequency response in the upper frequency range takes place, which eliminates the oscillation tendency. In the feedback state without oscillation tendency, the frequency response compensation switch is opened, the frequency response compensation capacitor is thus rendered ineffective, and the frequency response of the feedback circuit is not compensated and thus not impaired either.

In an embodiment of the invention, the circuit arrangement comprises an amplifier which is fed back via a switched capacitor (SC) circuit including a series connection that is connected between a signal output and a signal input of the amplifier and includes an SC capacitor and a first switch located between the signal input and the SC capacitor and a second SC switch connected between the SC capacitor and the signal output. The two SC switches switch the SC capacitor, in a second switching state, in series between signal input and signal output of the amplifier and, in a first switching state, the two SC switches connect the SC capacitor on both sides to ground. The frequency response compensation switch can be rendered conducting during the second switching state of the two SC switches and non-conducting during the first switching state of the SC switches.

In another embodiment of the invention comprising a comparator having its signal input and signal output connected to each other via a feedback switch which, in the first feedback state, is rendered non-conducting and, in the second feedback state, is rendered conducting, the frequency response compensation switch is rendered conducting and non-conducting in synchronism with the feedback switch. In this manner, a frequency response compensation takes place always only then when the feedback switch is conducting and when an oscillation tendency is present without frequency response compensation. The signal output of the comparator may further be connected to a latch or sample and hold circuit.

In a further embodiment of the invention, the circuit arrangement with an offset-inflicted comparator according to the invention is used in a analog-signal to square-wave-signal reshaping circuit, with the comparator being adapted to perform threshold-dependent shaping of an analog signal supplied to the signal input thereof into a square wave signal that is available at the signal output thereof with offset compensation of the offset-inflicted comparator. The feedback switch effecting feedback of the comparator and the frequency response compensation switch, between the periods of time of adjacent pulse edges of the square wave signal, can be switched in synchronism temporarily to the conducting state and can be switched in synchronism to the non-conducting state within a time window containing the pulse edges of the square wave signal. For performing said offset compensation, there is provided an offset storage capacitor which is connected in series between an analog signal source and the signal input of the comparator. The offset storage capacitor can be charged to a charging voltage corresponding to the offset voltage of the offset-inflicted comparator by rendering the feedback switch conducting, with said charging voltage, after subsequent switching over of the feedback switch to the non-conducting state, being adapted to be superimposed on the analog signal delivered from the analog signal source for offset compensation.

The invention will be elucidated now in more detail by way of non-limitative examples of embodiments shown in the attached drawings.

BRIEF DESCRIPTION OF THE DRAWINGS

FIG. 1 shows a first embodiment of a circuit arrangement according to the invention for analog-signal to square-wave-signal reshaping with switchable frequency response compensation.

FIG. 2 shows a conventional operational amplifier with a feedback via an ohmic resistor.

FIG. 3 shows an operational amplifier with a switch capacitor feedback and a switchable frequency response compensation according to the invention.

DETAILED DESCRIPTION OF THE INVENTION

The circuit arrangement shown in FIG. 1 is an analog-signal to square-wave-signal reshaping circuit with offset compensation and switchable frequency response compensation. With the exception of the circuit part effecting the switchable frequency response compensation, the circuit arrangement shown in FIG. 1 is identical with the analog-signal to square-wave-signal reshaping circuit described with respect to circuit construction, purpose and function in detailed manner in the already mentioned simultaneously filed patent application U.S. patent application Ser. No. 08/994,073 whose content, by making reference thereto, is herewith expressly introduced into the disclosure contents of the present application.

Referring to FIG. 1, an analog signal source in the form of an analog amplifier AMP having a signal input E delivers an analog signal via an offset storage capacitor Cs to an inverting signal input SE of a comparator COM, a noninverting reference input RE of which is fed with a reference voltage by means of which a threshold value is defined for the comparator. This threshold value serves as a discrimination threshold for analog-signal to square-wave-signal reshaping. Since comparators are inherently inflicted with an offset voltage which has the effect of a falsification of the discrimination threshold, the offset error of the comparator in the square wave signal available at a comparator output CA results in a falsification with respect to the moments of time at which the edges of the square wave signal occur. The comparator output CA is further connected to a latch or sample and hold circuit SH, the output of which constitutes an output A of the analog-signal to square-wave-signal reshaping circuit.

This problem is eliminated by an offset compensation for which are provided the offset storage capacitor Cs and a feedback switch Sr connected between SE and CA. By means of a switch control circuit SSE, feedback switch Sr is controllable in such a manner that it is in the non-conducting state during the time period including the pulse edges of the square wave signal, and is temporarily in the conducting state in time periods spaced from the pulse edges, namely, during time windows between adjacent pulse edges of the square wave signal. To this end, a detection signal is generated by means of a detection circuit which receives an input from the output of square wave signal at node A, at such moments of time in which the analog signal or the square wave signal passes a specific detection threshold, for example at the time of a zero crossing, the detection signal is delayed by a predetermined period of time, the time window is opened at the end of the delay time, and a time window signal ZF is supplied via a control input CE to the switch control circuit SSE during the duration of the time window. In an alternative embodiment, the input to the detection circuit is taken from the analog input signal at node E or from node SE and is not taken from the digital output at Node A. This permits use of the analog input signal to generate a detection signal.

During the duration of the time window, feedback switch Sr is rendered conducting and in this manner a second feedback state is created in which a complete feedback is caused between CA and SE of comparator COM. Outside of the time window, feedback switch Sr is non-conducting, thus effecting a first feedback state in which no feedback whatsoever is present.

In case of an ideal comparator without offset, identical voltage values are present at the three terminals SE, RE and CA. Due to the offset voltage of comparator COM, during feedback via the conducting feedback switch Sr, a voltage value occurs in reality at signal input SE which is by the offset voltage higher than the value at the terminals RE and CA of comparator COM. The offset storage capacitor Cs thus will be charged to the offset voltage while feedback switch Sr is rendered conducting.

When the comparator COM, by opening of feedback switch Sr at the end of the time window, is reset to its normal comparator mode of operation, the offset voltage stored in offset voltage capacitor Cs is superimposed on the analog signal delivered by the amplifier AMP. The potential jump taking place at the comparator output CA upon passage of the comparator threshold, despite offset behavior of comparator COM, thus may occur already at such a signal value of the analog signal which, without offset compensation, would not yet be capable of effecting such a potential jump at the comparator output CA.

Because of the high gain a comparator usually has, the total feedback by rendering the feedback switch Sr conducting during the time window causes an undesirable oscillation tendency of the fed back comparator COM to be present during the time window. According to the invention, this tendency is eliminated with the aid of a frequency response compensation circuit comprising a series connection connected between the comparator output CA and the ground and including a frequency response compensation switch Sfg and a frequency response compensation capacitor Cfg. Frequency response compensation switch Sfg is adapted to be controlled to the conducting and non-conducting states in synchronism with feedback switch Sr, in such a manner that frequency response compensation capacitor Cfg, by rendering frequency response compensation switch Sfg conducting, is switched to a frequency-response-compensating state during those times in which feedback switch Sr is conducting. If, however, Sr is not conducting, Sfg is also non-conducting, so that frequency response compensation capacitor Cfg is separated from comparator output CA and performs no frequency response compensation, i.e., during times in which the feedback branch of comparator COM is open and when there is no oscillation tendency.

Due to the fact that the frequency response compensation is carried out in the form of curtailing the frequency response in the upper frequency range only during the duration of the time window, i.e., only during periods outside of the edges of the square wave signal, and no frequency response compensation takes place during occurrence of these edges, the oscillation tendency of this circuit arrangement is eliminated without impairing the edge steepness of the square wave pulses.

If, as is done in conventional manner, a frequency response compensation would be performed permanently, the oscillation tendency indeed would be successfully eliminated, however the steepness of the edges of the square wave signal would be reduced.

A second embodiment of the invention will now be elucidated by way of FIGS. 2 and 3. FIG. 2 shows in generally known manner part of an amplifier comprising an operational amplifier OP and an ohmic feedback resistor R. Ohmic resistors need much chip area in monolithically integrated semiconductor circuits and, with normal expenditure, can be manufactured with relatively coarse tolerances only. This problem has been overcome in the field of integrated semiconductor circuits by replacing ohmic resistors by so-called switched capacitors, which are referred to as SC (switched capacitors) circuits.

FIG. 3 shows an example of an amplifier the operational amplifier of which is fed back in SC technology. To this end, an operational amplifier OP has in its feedback branch a series connection of an SC capacitor C, a first switch S1 connecting C to a signal input SE, and a second switch S2 connecting C to a signal output SA of operational amplifier OP. Both switches S1 and S2 are controllable in synchronism via a clock signal Φ to a second switching state, in which they establish a feedback between SA and SE via C, and a first switching state, in which they connect both sides of C to ground each. The SC circuit comprising C, S1 and S2, which is periodically switched over by means of Φ between the two switching states, has the same effect as the ohmic resistor R in FIG. 2, but allows monolithic integration thereof with less space required and with closer tolerances than in case of an ohmic resistor.

Since operational amplifiers generally have a high gain, an oscillation tendency of the fed back operational amplifier OP may arise in the feedback states in which a feedback passes via C. This oscillation tendency is eliminated by switchable frequency response compensation circuit having the same circuit construction as that in FIG. 1, namely a series connection of a frequency response compensation switch Sfg and a frequency response compensation capacitor Cfg, which is connected between the signal output SA of operational amplifier OP and ground.

Due to the fact that a feedback via SC capacitor C is present only during the second switching state (shown in FIG. 3) of S1 and S2, frequency response compensation switch Sfg is rendered conducting only during this second switching state of S1 and S2, but not during those periods of time in which S1 and S2 are in the first switching state and the feedback via SC capacitor C is thus interrupted.

Frequency response curtailing in the upper frequency range and along therewith a reduction of the gain-bandwidth product by the frequency response compensation circuit Sfg and Cfg thus does not occur while the feedback branch of OP is open, but only during the times of feedback via SC capacitor C.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An electric circuit arrangement comprising:
   a switchable feedback branch which is switchable between a first feedback state, in which the circuit arrangement has a frequency response that is stable with respect to an oscillation tendency, and a second feedback state, in which the circuit arrangement has a frequency response that is unstable with respect to an oscillation tendency;
   a switchable frequency response compensation circuit which during the first feedback state of the feedback branch can be controlled to a nonfeedback mode and during the second feedback state of the feedback branch is controlled to a feedback mode, and in the feedback mode causes such compensation of the frequency response of the circuit arrangement in the second feedback state that the circuit arrangement in the second feedback state is stable with respect to an oscillation tendency, the frequency response compensation circuit comprising a series connection having a controllable frequency response compensation switch and a frequency response compensation capacitor and is connected between an output of the circuit arrangement and a ground terminal; and
   an amplifier that is fed back via a switch capacitor circuit having a series connection connected between a signal output and a signal input of the amplifier and including a switch capacitor, a first switch capacitor switch connected between the signal input and the switch capacitor, and a second switch capacitor switch connected between the switch capacitor and the signal output, with the two switch capacitor switches in a first switching state connecting the switch capacitor on both sides to ground and the two switch capacitor switches in a second switching state connecting the switch capacitor in series between the signal input and the signal output of the amplifier, and with the frequency response capacitor being adapted to be rendered nonconducting during the first switching state of the two SC switches and being adapted to be rendered conducting during the second switching state of the SC switches.

2. The electric circuit arrangement of claim 1 wherein the frequency response compensation circuit is disposed outside of the feedback network.

3. An analog-signal to square-wave-signal reshaping circuit comprising:
   a switchable feedback branch which is switchable between a first feedback state, in which the circuit arrangement has a frequency response that is stable with respect to an oscillation tendency, and a second feedback state, in which the circuit arrangement has a frequency response that is unstable with respect to an oscillation tendency;
   switchable frequency response compensation circuit which during the first feedback state of the feedback branch can be controlled to a nonfeedback mode and during the second feedback state of the feedback branch is controlled to a feedback mode, and in the feedback mode causes such compensation of the frequency response of the circuit arrangement in the second feedback state that the circuit arrangement in the second feedback state is stable with respect to an oscillation tendency, the frequency response compensation circuit comprising a series connection having a controllable frequency response compensation switch and a frequency response compensation capacitor and is connected between an output of the circuit arrangement and a ground terminal;
   an amplifier that is fed back via a switch capacitor circuit having a series connection connected between a signal output and a signal input of the amplifier and including a switch capacitor, a first switch capacitor switch connected between the signal input and the switch capacitor, and a second switch capacitor switch connected between the switch capacitor and the signal output, with the two switch capacitor switches in a first switching state connecting the switch capacitor on both sides to ground and the two switch capacitor switches in a second switching state connecting the switch capacitor in series between the signal input and the signal output of the amplifier, and with the frequency response capacitor being adapted to be rendered nonconducting during the first switching state of the two SC switches and being adapted to be rendered conducting during the second switching state of the SC switches;
   a comparator having a signal input and a comparator output that are connected to each other via a controllable feedback switch, such that said comparator, when the feedback switch is non-conducting, is in a feedback-free first feedback state and, when the feedback switch is conducting, is in a second feedback state with feedback, with the frequency response compensation switch being adapted to be rendered conducting and non-conducting in synchronism with the feedback switch, wherein the comparator is offset-inflicted and by means of which threshold-dependent reshaping of an analog signal fed to its signal input into a square wave signal can be performed which is available from its comparator output, the feedback switch and the frequency response compensation switch thereof being adapted to be switched in synchronism temporarily to the conducting state between periods of time of adjacent pulse edges of the square wave signal, and to the non-conducting state in a time period including the pulse edges of the square wave signal, and comprising an offset storage capacitor which is connected in series between an analog signal source and the signal input of the comparator and which can be charged to a charging voltage corresponding to an offset voltage of the comparator by rendering the feedback switch conducting, with said charging voltage, after subsequent switching over of the feedback switch to the non-conducting state, being adapted to be superimposed on the analog signal delivered from the analog signal source for offset compensation.

4. An electric circuit comprising:
    a switchable feedback branch, said switchable feedback branch being switchable between a first feedback state having a stable frequency response with respect to an oscillation tendency and a second feedback state having an unstable response with respect to an oscillator tendency;
    a switchable frequency response compensation circuit, said frequency response compensation circuit being switchable in synchronism with said switchable feedback branch to an inactive state for the first feedback state and to an active state for the second feedback state;
    a switch control circuit having an input for receiving a time window signal and an output coupled to said switchable feedback branch and to said switchable frequency response compensation circuit wherein said switch control circuit controls said switchable feedback branch and said switchable frequency response compensation circuit to switch in synchronism in response to the time window signal; and
    a detection circuit coupled to an output of the electric circuit and having an output coupled to the input of said switch control circuit and providing said time window signal to said switch control circuit.

5. The electric circuit of claim 4, further comprising a latch circuit coupled between an output of the switchable feedback branch and the output of the electric circuit.

6. The electric circuit of claim 4 wherein the frequency response compensation circuit is disposed outside of the electric circuit.

7. The electric circuit of claim 4 wherein the frequency response compensation circuit comprises a frequency response compensation switch and a frequency response compensation capacitor connected in series to said frequency response compensation switch, said frequency response compensation circuit being coupled between the output of the electric circuit and a ground terminal.

8. The electric circuit of claim 7 wherein said switchable feedback branch comprises a feedback switch, said feedback switch being controlled to a conducting or a non-conducting state in synchronism with the frequency response compensation switch.

9. The electric circuit of claim 8, further comprising a comparator circuit having a signal input and a signal output, said signal output being connected to the output of the electric circuit and to the signal input through the feedback switch, said comparator circuit being feedback free in the first feedback state when the feedback switch is non-conducting and being in feedback in the second feedback state when the feedback switch is conducting.

10. The electric circuit of claim 7 wherein said switchable feedback branch comprises a switch capacitor circuit having a first and a second switch capacitor switch and a switch capacitor connected in series between the first and the second switch capacitor switch, said first and said second switch capacitor switch being controlled to a conducting or a non-conducting state in synchronism with the frequency response compensation switch.

11. The electric circuit of claim 10, further comprising an amplifier circuit having a signal input and a signal output, said signal output being connected to the output of the electric circuit and to said signal input through said switch capacitor circuit, said amplifier circuit being feedback free in the first feedback state when the switch capacitor circuit is non-conducting and being in feedback in the second feedback state when the switch capacitor circuit is conducting.

12. An analog-signal to square-wave-signal reshaping circuit comprising:
    a comparator circuit having a signal input and a signal output;
    a frequency response compensation circuit having a frequency response compensation switch and a frequency response compensation capacitor connected in series to said frequency response compensation switch, said frequency response compensation circuit being coupled between the signal output of the comparator circuit and a ground terminal;
    an analog signal source, said analog signal source providing an analog signal into the signal input of the comparator circuit to be converted into a square wave signal at the signal output of the comparator circuit;
    a feedback switch, said feedback switch being connected between the signal input and the signal output of the comparator circuit and being controlled to a conducting state in synchronism with the frequency response compensation switch between periods of time of adjacent pulse edges of the square wave signal and to a non-conducting state in synchronism with the frequency response compensation switch at a time window adjacent to and including the pulse edges of the square wave signal; and
    an offset storage capacitor circuit coupled in series between the analog signal source and the signal input of the comparator circuit, said offset storage capacitor circuit being charged to an offset voltage when the feedback switch is conducting, said offset storage capacitor circuit superimposing said offset voltage on the analog signal for offset compensation when the feedback switch is non-conducting.

13. The analog-signal to square-wave-signal reshaping circuit of claim 12, further comprising:
    a switch control circuit having an input for receiving a time window signal and an output coupled to the feedback switch of the comparator circuit, said switch control circuit controlling the feedback switch and the frequency response compensation circuit to switch in synchronism in response to the time window signal; and
    a detection circuit coupled to an output of the reshaping circuit and providing said time window signal to said switch control circuit.

14. The analog-signal to square-wave-signal reshaping circuit of claim 13, further comprising a latch circuit coupled between the signal output of the comparator circuit and the output of the reshaping circuit.

15. A method for reshaping an analog-signal to a square-wave-signal of an electric circuit, said method comprising the steps of:
    providing an analog signal to the electric circuit;
    superimposing an offset voltage present in an offset storage capacitor upon the analog signal and providing the offset analog signal to a comparator;

generating a first pulse edge of the square-wave-signal by the comparator when the offset analog signal reaches a threshold value;

providing a detection signal to a switch control circuit;

rendering a feedback switch and a frequency response compensation switch in the conducting state and stabilizing a frequency response with respect to an oscillation tendency by conducting the frequency response compensation circuit;

charging the offset storage capacitor to establish an offset voltage; and rendering the feedback switch and the frequency response compensation switch in the non-conducting state.

16. The method of claim 15 wherein the step of providing a detection signal comprises:

providing a delay signal having a predetermined delay time period; and providing a time window signal to the switch control circuit.

* * * * *